United States Patent
Riihiaho

(10) Patent No.: US 11,392,208 B2
(45) Date of Patent: Jul. 19, 2022

(54) HAPTIC ELEMENT MATRIX

(71) Applicant: Aito BV, Amsterdam (NL)

(72) Inventor: Jukka Riihiaho, Vantaa (FI)

(73) Assignee: AITO BV, Amsterdam (NL)

( * ) Notice: Subject to any disclaimer, the term of this patent is extended or adjusted under 35 U.S.C. 154(b) by 0 days.

(21) Appl. No.: 17/436,717

(22) PCT Filed: Mar. 6, 2020

(86) PCT No.: PCT/EP2020/055993
§ 371 (c)(1),
(2) Date: Sep. 7, 2021

(87) PCT Pub. No.: WO2020/178422
PCT Pub. Date: Sep. 10, 2020

(65) Prior Publication Data
US 2022/0100277 A1 Mar. 31, 2022

(30) Foreign Application Priority Data
Mar. 7, 2019 (FI) .................................. 20195168

(51) Int. Cl.
G06F 3/01 (2006.01)
G06F 3/041 (2006.01)
H03K 17/96 (2006.01)

(52) U.S. Cl.
CPC ............ G06F 3/016 (2013.01); G06F 3/0412 (2013.01); G06F 3/0416 (2013.01); H03K 17/9643 (2013.01); H03K 2217/96062 (2013.01)

(58) Field of Classification Search
CPC ...... G06F 3/016; G06F 3/0412; G06F 3/0416; H03K 2217/96062
See application file for complete search history.

(56) References Cited

U.S. PATENT DOCUMENTS 8,552,846 B2 10/2013 Cordoba et al.
10,877,616 B2 * 12/2020 Liu .................. G06F 3/046
(Continued)

FOREIGN PATENT DOCUMENTS

EP 1266346 A2 12/2002
EP 3425482 A2 1/2019
(Continued)

OTHER PUBLICATIONS

International Search Report and Written Opinion (ISA/EP) for PCT/EP2020/055993 dated Jun. 15, 2020 (12 pages).
(Continued)

*Primary Examiner* — Liliana Cerullo
(74) *Attorney, Agent, or Firm* — Alston & Bird LLP

(57) ABSTRACT

It is an object to provide a device that may provide haptic effect. According to an embodiment, a device comprises a haptic element matrix comprising haptic effect elements, wherein the haptic effect elements are electrically arranged into rows and columns and a driving circuit. The driving circuit may be configured to, in a first phase drive an addressed column of the haptic element matrix with a first voltage; drive an addressed row of the haptic element matrix with a second voltage, leave at least one column of the haptic element matrix to a floating voltage while driving the addressed column and the addressed row; and leave at least one row of the haptic element matrix to a floating voltage while driving the addressed column and the addressed row. The device may reduce crosstalk between the haptic effect elements. A device, a method, and a computer program product is provided.

15 Claims, 6 Drawing Sheets

(56) References Cited

U.S. PATENT DOCUMENTS

| | | |
|---|---|---|
| 11,144,156 B2* | 10/2021 | Kim .................. G06K 9/00912 |
| 2009/0146533 A1 | 6/2009 | Leskinen et al. |
| 2015/0097659 A1 | 4/2015 | Makinen et al. |
| 2015/0103024 A1* | 4/2015 | Haga ....................... G06F 3/016 |
| | | 345/173 |
| 2016/0349880 A1 | 12/2016 | Colgate et al. |
| 2016/0351026 A1 | 12/2016 | Sugimoto et al. |
| 2017/0192560 A1 | 7/2017 | Ham et al. |
| 2018/0356889 A1* | 12/2018 | Khoshkava ........... G06F 3/0445 |

FOREIGN PATENT DOCUMENTS

| | | |
|---|---|---|
| WO | WO-2013/129101 A1 | 9/2013 |
| WO | WO-2017/173386 A1 | 10/2017 |
| WO | WO-2017/212028 A1 | 12/2017 |
| WO | WO-2018/141962 A1 | 8/2018 |

OTHER PUBLICATIONS

International Preliminary Report on Patentability for PCT/EP2020/055993 (IPEA/EP) dated Jul. 2, 2021 (15 pages).

Search Report for Finnish Application No. 20195168 dated Jun. 11, 2019 (2 pages).

* cited by examiner

HAPTIC ELEMENT MATRIX

CROSS-REFERENCE TO RELATED APPLICATIONS

The present application is a national phase entry of International Application No. PCT/EP2020/055993, filed Mar. 6, 2020, which claims priority to Finnish Application No. 20195168, filed Mar. 7, 2019, which are incorporated herein by reference in their entirety.

TECHNICAL FIELD

The present application relates generally to a touch user interface of a device, and more specifically to haptic effect for such device.

BACKGROUND

Haptic effect, for example provided by haptic effect elements, such as piezoelectric elements, can be utilized in providing haptic effect in various applications. For example, an individual key, a button, or a keyboard may be implemented without actual actuation of keys. Instead, haptic effect elements may provide the sensation of key actuation to a user when a touch interface is pressed or otherwise actuated.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object to provide a device that may provide haptic effect. The object is achieved by the features of the independent claims. Further implementation forms are provided in the dependent claims, the description and the figures.

According to a first aspect, a device comprises: a haptic element matrix comprising haptic effect elements, wherein the haptic effect elements are electrically arranged into rows and columns; and a driving circuit configured to, in a first phase: drive an addressed column of the haptic element matrix with a first voltage; drive an addressed row of the haptic element matrix with a second voltage; leave at least one column of the haptic element matrix to a floating voltage while driving the addressed column and the addressed row; and leave at least one row of the haptic element matrix to the floating voltage while driving the addressed column and the addressed row. Since the driving circuit may leave the non-addressed rows and/or columns floating, unwanted parasitic haptic effect in non-addressed haptic effect elements may be reduced.

In an implementation form of the first aspect, one of: the first voltage and the second voltage, comprises a voltage pulse, and the other comprises a substantially constant reference voltage. With these configurations, the driving circuit may, for example, address a haptic effect element even with a single voltage pulse.

In a further implementation form of the first aspect, an impedance between the floating column/row and the substantially constant reference voltage is at least 100 kiloohms. With such impedance, the column/row can be considered floating, and parasitic haptic effect may be reduced.

In a further implementation form of the first aspect, the driving circuit is further configured to, in a second phase, after the first phase: drive the addressed column of the haptic element matrix with a third voltage; drive the addressed row of the haptic element matrix with a fourth voltage; leave at the least one column of the haptic element matrix to a floating voltage while driving the addressed column and the addressed row; and leave the at least one row of the haptic element matrix to a floating voltage while driving the addressed column and the addressed row. With such configuration, the device may, for example, provide more pronounced haptic effect using the first and the second phase.

In a further implementation form of the first aspect, the second voltage and the third voltage comprise the substantially constant reference voltage and the first voltage comprises a first voltage pulse and the fourth voltage comprises a second voltage pulse; or the first voltage and the fourth voltage comprise the substantially constant reference voltage and the second voltage comprises a first voltage pulse and the third voltage comprises a second voltage pulse. With such configuration, the device may, for example, provide more pronounced haptic effect using the first and the second voltage pulse.

In a further implementation form of the first aspect, the first voltage pulse and the second voltage pulse have a same polarity with respect to the substantially constant reference voltage. With such configuration, the device may, for example, provide even more pronounced haptic effect using the first and the second voltage pulse, since the polarity of the voltage over the addressed haptic effect element may change between the first and the second phase. Furthermore, this may be achieved with less hardware, such as voltage boosters.

In a further implementation form of the first aspect, the second voltage and the fourth voltage comprise the substantially constant reference voltage and the first voltage comprises a first voltage pulse and the third voltage comprises a second voltage pulse; or the first voltage and the third voltage comprise the substantially constant reference voltage and the second voltage comprises a first voltage pulse and the fourth voltage comprises a second voltage pulse. With such configuration, the device may, for example, provide more pronounced haptic effect using the first and the second voltage pulse.

In a further implementation form of the first aspect, the first voltage pulse and the second voltage pulse have opposite polarities with respect to the substantially constant reference voltage. With such configuration, the device may, for example, provide even more pronounced haptic effect using the first and the second voltage pulse, since the polarity of the voltage over the addressed haptic effect element may change between the first and the second phase.

In a further implementation form of the first aspect, the driving circuit is further configured to: address at least two different haptic effect elements in the haptic element matrix consecutively. With such configurations, the device may, for example, reduce possible problems with addressing multiple haptic effect elements at once.

In a further implementation form of the first aspect, a time interval between the consecutive addressings is short enough that haptic effects due to the consecutive addressings seem simultaneous to a human. With such configurations, the device may reduce possible problems with addressing multiple haptic effect elements at once while providing seemingly simultaneous haptic effect from two or more haptic effect elements.

In a further implementation form of the first aspect, the time interval between the consecutive addressings is less than 30 milliseconds. With such configurations, the consecutive haptic effects may seem simultaneous to a user.

In a further implementation form of the first aspect, the haptic effect elements comprise piezoelectric elements. With such configurations, the device may, for example, be able to provide high quality haptic effect.

In a further implementation form of the first aspect, the haptic effect elements in the haptic element matrix are further configured to detect touch. With such configurations, the device may, for example, sense touches on a touch interface and provide haptic effect based on the sensed touches.

In a further implementation form of the first aspect, a first terminal of the haptic effect element is connected to a row conductor of the rows and a second terminal of the haptic effect element is connected to a column conductor of the columns. With such configuration, the haptic effect element may be connected to the respective rows and columns in the matrix, without the rows and columns disturbing each other's.

In a further implementation form of the first aspect, a haptic effect is produced to a certain haptic effect element situated at an intersection of the driven addressed row and the driven addressed column. The strongest haptic effect is produced to the intersection and any haptic effect by a crosstalk to other intersections not being addressed is milder.

In a further implementation form of the first aspect, a keyboard matrix includes different keys, wherein the keys are configured to the keyboard matrix so that neighboring keys of a certain key corresponding to a certain haptic effect element are different from neighboring haptic effect elements of the certain haptic effect element. This way, if any unwanted haptic effect is generated in a non-addressed haptic effect element due to a neighboring haptic effect element being addressed, the unwanted haptic effect may be less likely to affect the haptic sensation felt by the user. For example a so-called QWERTY-keyboard may be designed in such a way that user's fingers may not be disturbed by unwanted haptic effects.

According to a second aspect, a method comprises: driving an addressed column of a haptic element matrix with a first voltage; driving an addressed row of the haptic element matrix with a second voltage; leaving at least one column of the haptic element matrix to a floating voltage while driving the addressed column and the addressed row; and leaving at least one row of the haptic element matrix to the floating voltage while driving the addressed column and the addressed row.

According to a third aspect, a computer program product is provided, comprising program code configured to perform a method according to the second aspect when the computer program is executed on a computing device.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings.

DETAILED DESCRIPTION

The detailed description provided below in connection with the appended drawings is intended as a description of the embodiments and is not intended to represent the only forms in which the embodiment may be constructed or utilized. However, the same or equivalent functions and structures may be accomplished by different embodiments.

Figure 1:
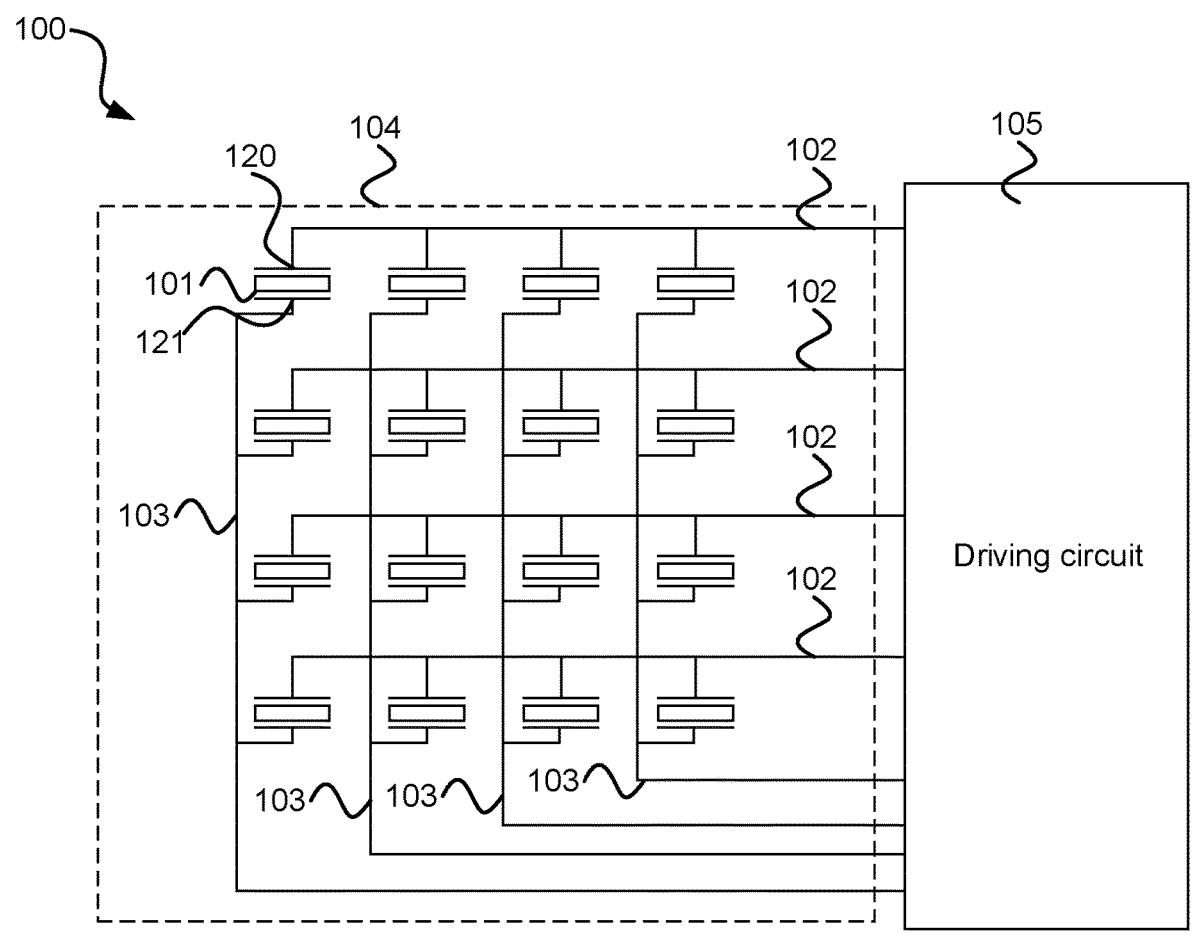
FIG. 1 illustrates a device comprising a haptic element matrix according to an embodiment.

FIG. 1 illustrates a schematic representation of a device 100 according to an embodiment. The device 100 may comprise a haptic element matrix 104. The haptic element matrix 104 may comprise a plurality of haptic effect elements 101. In FIG. 1, only one haptic effect element 101 is marked with a reference number for clarity purposes. The haptic effect elements 101 may be, for example, piezoelectric haptic effect elements.

According to an embodiment, the device 100 comprises a haptic element matrix 104. The haptic element matrix may comprise haptic effect elements 101. The haptic effect elements 101 may be electrically arranged into rows and columns.

The device 100 may further comprise a driving circuit 105 configured to, in a first phase: drive an addressed column of the haptic element matrix 104 with a first voltage. The driving circuit 105 may be further configured to drive an addressed row of the haptic element matrix 104 with a second voltage. The driving circuit 105 may be further configured to leave at least one column 103 of the haptic element matrix 104 to a floating voltage while driving the addressed column and the addressed row. The driving circuit 105 may be further configured to leave at least one row 102 of the haptic element matrix to the floating voltage while driving the addressed column and the addressed row.

The driving circuit 105 may comprise, for example, a voltage booster circuit, computing device, such as a microcontroller, and other components used to drive the haptic effect elements 101. The voltage booster may provide a high voltage that may be needed to drive the haptic effect elements 101. The microcontroller may addressing of the haptic effect elements 101.

The driving circuit 105 may comprise at least one processor. The at least one processor may comprise, for example, one or more of various processing devices, such as a co-processor, a microprocessor, a controller, a digital signal processor (DSP), a processing circuitry with or without an accompanying DSP, or various other processing devices including integrated circuits such as, for example, an application specific integrated circuit (ASIC), a field programmable gate array (FPGA), a microcontroller unit (MCU), a hardware accelerator, a special-purpose computer chip, or the like.

The driving circuit 105 may further comprise a memory. The memory may be configured to store, for example, computer programs and the like. The memory may comprise one or more volatile memory devices, one or more non-volatile memory devices, and/or a combination of one or more volatile memory devices and non-volatile memory devices. For example, the memory may be embodied as magnetic storage devices (such as hard disk drives, floppy disks, magnetic tapes, etc.), optical magnetic storage devices, and semiconductor memories (such as mask ROM, PROM (programmable ROM), EPROM (erasable PROM), flash ROM, RAM (random access memory), etc.).

When the driving circuit 105 is configured to implement some functionality, some component and/or components of the driving circuit 105, such as the at least one processor and/or the memory, may be configured to implement this functionality. Furthermore, when the at least one processor is configured to implement some functionality, this functionality may be implemented using program code comprised, for example, in the memory.

The haptic effect elements 101 may be arranged into rows 102 and columns 103 in the haptic element matrix 104. Each row may comprise a row conductor, and each column may comprise a column conductor. Each haptic effect element in a row 102 may be electrically coupled to the corresponding row conductor, and each haptic effect element in a column 103 may be electrically coupled to the corresponding column conductor.

Each haptic effect element 101 may comprise two terminals 120, 121. One terminal 121 may be connected to a row conductor of the haptic element matrix and one terminal 121 may be connected to a column conductor of the haptic element matrix. When a voltage is applied between the row connector and the column connector, the haptic effect element that is connected to the row and the column may provide haptic effect via, for example, the piezoelectric effect. The term "row" may refer to haptic effect elements 101 that are electrically coupled to a certain row and/or to the corresponding row conductor. The term "column" may refer to haptic effect elements 101 that are electrically coupled to a certain row and/or to the corresponding column conductor.

Herein, the term "addressing" may refer to applying a voltage over a certain haptic effect 101 element in the haptic element matrix 104. For example, the driving circuit 105 may apply a voltage between a row 102 and a column 103 of the haptic element matrix 104 by applying a voltage between the corresponding row conductor and column conductor. Such a row and column may be referred to as an addressed row and an addressed column, respectively. The applied voltage may cause a haptic effect element 101 in the addressed row and the addressed column to provide a haptic effect. Such haptic effect element 101 may be referred to as an addressed haptic effect element.

The rows 102 and columns 103 may only refer to the electrical arrangement of the haptic effect elements 101. The haptic effect elements 101 may be arranged spatially into many different arrangements that may differ from the electrical arrangement. Furthermore, even if the haptic effect elements 101 are arranged spatially into a matrix, this spatial arrangement does not necessarily correspond to the electrical arrangement in the haptic element matrix 104. For example, two spatially neighboring haptic effect elements 101 may not be neighboring in the electrical arrangement of the haptic element matrix 104.

Each haptic effect element 101 may be addressed by applying a voltage to the corresponding row 102 and column 103. For example, the top left haptic effect element 101 presented in FIG. 1 may be addressed by applying a voltage between the top row conductor 102 and the left most column conductor 103. Such addressing may decrease the amount of needed electronics hardware, such as piezo drivers, channel selectors, and physical wires between the driving circuit 105 and the haptic effect elements 101, compared to other arrangements.

When the haptic effect elements 101 are connected as matrix, the matrix may be considered a network of capacitive elements. For example, if the haptic effect elements 101 are piezoelectric elements, such piezoelectric elements can effectively be characterized as capacitors in an electrical sense. Thus, the haptic element matrix 104 may comprise systematic capacitive connections via the haptic effect elements 101 between the rows 102 and the columns 103. This can cause unwanted crosstalk between an addressed haptic effect element and non-addressed haptic effect elements. The crosstalk signals may effectively be parasitic haptic signals to the non-addressed haptic effect elements, and might confuse the user or ruin the user experience.

Although some functionality of the device 100 may be disclosed using terms such as "row" and "column", these terms should not be considered limiting. For example, as a person skilled in the art can appreciate, functionality of the rows and columns may be interchanged without losing the effect sought.

The user may also perceive the haptic effect as a feedback, i.e. haptic feedback for example after touching or pressing a button or a key of the matrix 104. Alternative or in addition to the above, the device 100 may output the haptic effect without a user interaction or a feedback, for example by another kind of actuation.

Figure 2:
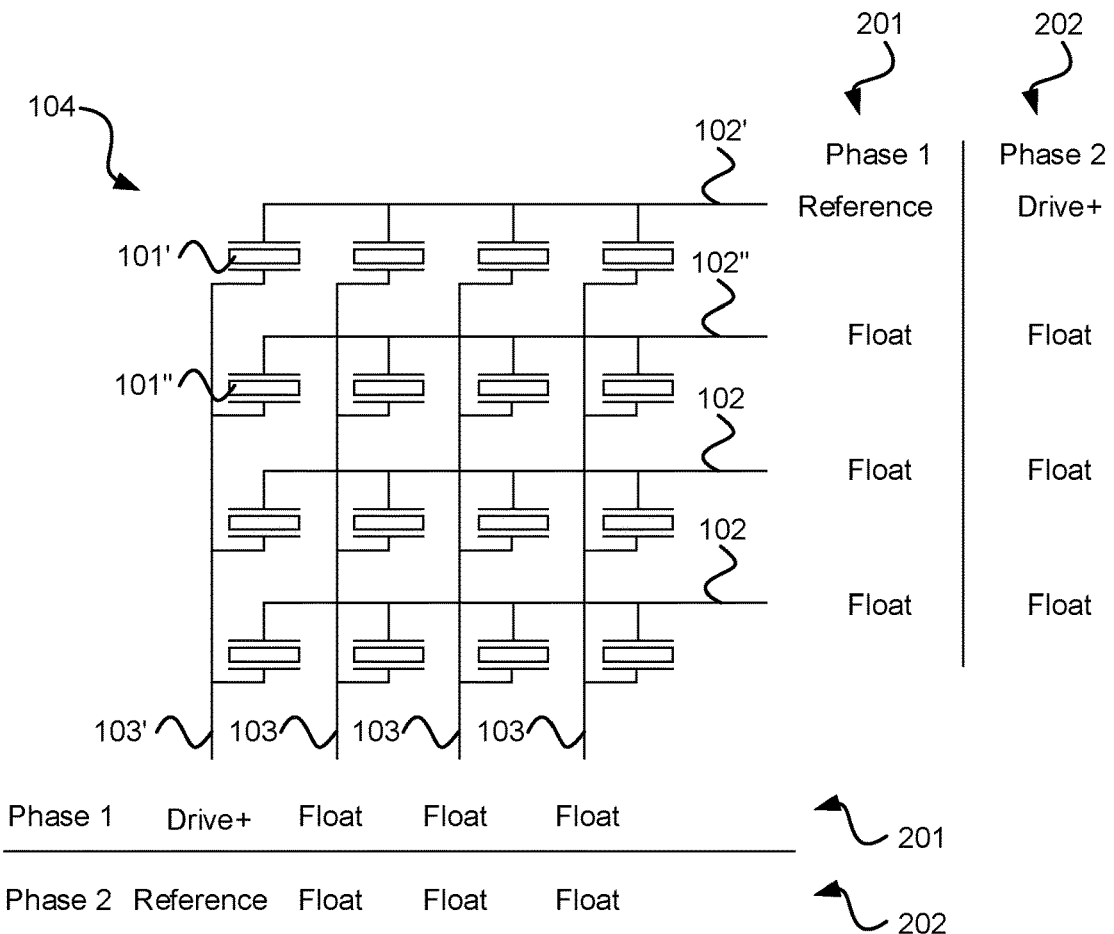
FIG. 2 illustrates a schematic representation of haptic effect element addressing according to an embodiment.

FIG. 2 illustrates a schematic representation of haptic effect element addressing according to an embodiment. In the embodiment of FIG. 2, the top left haptic effect element is addressed 101. However, this is only an embodiment, and any haptic effect element 101 in the haptic element matrix 104 may be addressed in a similar fashion as described herein.

The haptic effect element 101' may be addressed in, for example, two phases, referred to as phase 1 201 and phase 2 202. Phase 2 202 may be performed after phase 1 201. Phase 1 201 and phase 2 202 may also be referred to as a first phase and a second phase, respectively. In FIG. 2, the voltages used for each row 102 and column 103 during phase 1 201 and phase 2 202 are presented.

In phase 1 201, the driving circuit 105 may drive a positive voltage to the left most column 103' and drive a reference voltage to the top most row 102'. Thus, there may be a voltage over the addressed haptic effect element 101'. The positive voltage may be, for example, a voltage pulse. The positive voltage may be positive with respect to the reference voltage. The reference voltage may be a substantially constant reference voltage.

While addressing the selected haptic effect element 101', the driving circuit 105 may leave other rows 102 and columns 103 floating. For example, the driving circuit 105 may leave all other rows 102 and columns 103 floating. This way, crosstalk to the non-addressed haptic effect elements 101 of the haptic element matrix 104 can be significantly reduced. This makes the non-addressed rows 102 and columns 103 high impedance compared to the driven row 102' and column 103', and may prevent most of the crosstalk via the non-addressed haptic effect elements 101, thus minimizing any unintended haptic signals.

The reference voltage may correspond to any substantially constant voltage. The reference voltage may not be connected to any ground/earth outside the device 100.

When a haptic effect element 101 is left floating, a corresponding row conductor 102 and/or column conductor 103 may be left floating. When a conductor or any other component is left floating, there may be a high impedance between the conductor and the reference voltage and/or there may be no conductive signal path between the reference voltage and the conductor. For example, a floating conductor may be substantially disconnected from the reference voltage. An impedance may be considered a "high impedance" when the impedance is, for example, at least 10, $10^2$, $10^3$, $10^4$, $10^5$, $10^6$, $10^7$, $10^8$, or $10^9$ times larger than the impedance between an addressed row/column and the reference voltage. For example, the impedance between a floating row/column and the reference voltage can be larger than 100 kilo-ohms (kΩ)), 1 mega-ohm (MΩ)), 10 MΩ, 100 MΩ, 1 giga-ohm (GΩ), 10 GΩ, or 100 GΩ.

In phase 2 202, the driving circuit 105 may drive a positive voltage to top row 102' and drive a reference voltage to the left most column 103'. Thus, there may be a voltage over the addressed haptic effect element 101'. The positive voltage may be, for example, a voltage pulse. Thus, the voltage over the addressed haptic effect element 101' in phase 2 202 may be a negative voltage compared to the voltage applied over the addressed haptic effect element 101' in phase 1 201. The driving circuit 105 may also leave non-addressed haptic effect elements 101 floating during phase 2 202 similarly to phase 1 201.

According to an embodiment, the driving circuit 105 is further configured to, in a second phase, after the first phase: drive the addressed column of the haptic element matrix with a third voltage; drive the addressed row of the haptic element matrix with a fourth voltage; leave at the least one column of the haptic element matrix to a floating voltage while driving the addressed column and the addressed row; and leave the at least one row of the haptic element matrix to a floating voltage while driving the addressed column and the addressed row.

The driving circuit 105 may also be configured to only implement phase 1 201 or phase 2 202.

The driving circuit 105 may also address more than one haptic effect element 101 simultaneously. For example, the driving circuit 105 may address a first haptic effect element 101' as described above. Additionally, the driving circuit 105 may also address a second haptic effect element 101" in the same column as the first addressed haptic effect element 101' by driving the reference voltage to the corresponding row 102" in phase 1 201 and by driving the positive voltage to the corresponding row 102" in phase 2 202. This way, the driving circuit 105 may address any number of haptic effect elements 101 in the same column 103'.

Similarly, the driving circuit 105 may also address a second haptic effect element 101 in the same row as the first addressed haptic effect element 101' by driving the positive voltage to the corresponding column 103 in phase 1 201 and by driving the reference voltage to the corresponding column 103 in phase 2 202. This way, the driving circuit 105 may address any number of haptic effect elements 101 in the same row 102'.

Alternatively, the positive voltage in phase 1 201 and/or in phase 2 202 can be a negative voltage. Furthermore, the driving circuit 105 may instead drive the addressed row 102' with the positive/negative voltage in phase 1 201 and drive the addressed column 103' with the reference voltage in phase 1. The driving circuit 105 may also drive the addressed column 103 with the positive/negative voltage in phase 2 202 and drive the addressed row 102' with the reference voltage in phase 1. These alternatives may apply to all embodiments disclosed herein.

Figure 3:
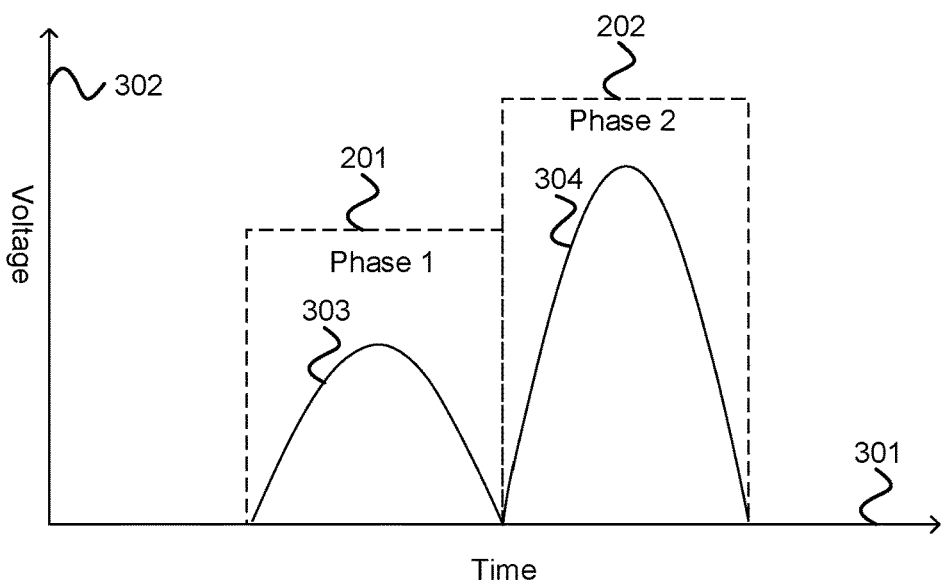
FIG. 3 illustrates a schematic representation of voltage pulses for haptic effect element addressing according to an embodiment.

FIG. 3 illustrates a schematic representation of driving voltages for addressing haptic effect elements according to an embodiment. In FIG. 3, the voltage 302 of the voltage pulses 303, 304 are presented as functions of time 301. The first voltage pulse 303 may be applied during phase 1 201, and the second voltage pulse 304 may be applied during phase 2 202. The voltage pulses 303, 304 may be generated, for example, by a voltage booster circuit comprised in the driving circuit 105. Although the amplitude of the first voltage pulse 303 may be illustrated as smaller than the amplitude of the second voltage pulse 304 in the embodiment of FIG. 3, this is only an example.

The driving circuit 105 may drive the first voltage pulse 303 to the addressed column 103' during phase 1 201 while driving the reference voltage to the addressed row 102'. During phase 2 202, on the other hand, the driving circuit 105 may drive the second voltage pulse 304 to the addressed row 102' while driving the reference voltage to the addressed column 103'. Alternatively or additionally, the driving circuit 105 may drive pulses similar to or not similar to the pulses 303, 304 in any other fashion.

Amplitude of the first voltage pulse 303 and/or amplitude of the second voltage pulse 304 may be in the range 50-500 volts (V). Amplitude of the first voltage pulse 303 and/or amplitude of the second voltage pulse 304 may also be in any subrange of this range, such as 100-200 V, 100-250 V, 50-200 V, 50-250 V, 100-500 V, or 50-500 V.

Duration of the first voltage pulse 303 and/or duration of the second voltage pulse 304 may be in the range 0-50 milliseconds (ms). Duration of the first voltage pulse 303 and/or duration of the second voltage pulse 304 may also be any subrange of this range, such as 1-10 ms, 1-20 ms, 2-10 ms, 2-20 ms, 1-30 ms, 2-30 ms, 3-20 ms, or 3-10 ms.

According to an embodiment, the second voltage and the third voltage comprise the substantially constant reference voltage and the first voltage comprises a first voltage pulse 303 and the fourth voltage comprises a second voltage pulse 304; or the first voltage and the fourth voltage comprise a substantially constant reference voltage and the second voltage comprises a first voltage pulse 303 and the third voltage comprises a second voltage pulse 304. For example, the first voltage pulse 303 and the second voltage pulse 304 may have a same polarity with respect to the substantially constant reference voltage. For example, the first voltage pulse 303 and the second voltage pulse 304 may be positive with respect to the substantially constant reference voltage, or the first voltage pulse 303 and the second voltage pulse 304 can be negative with respect to the substantially constant reference voltage.

Figure 4:
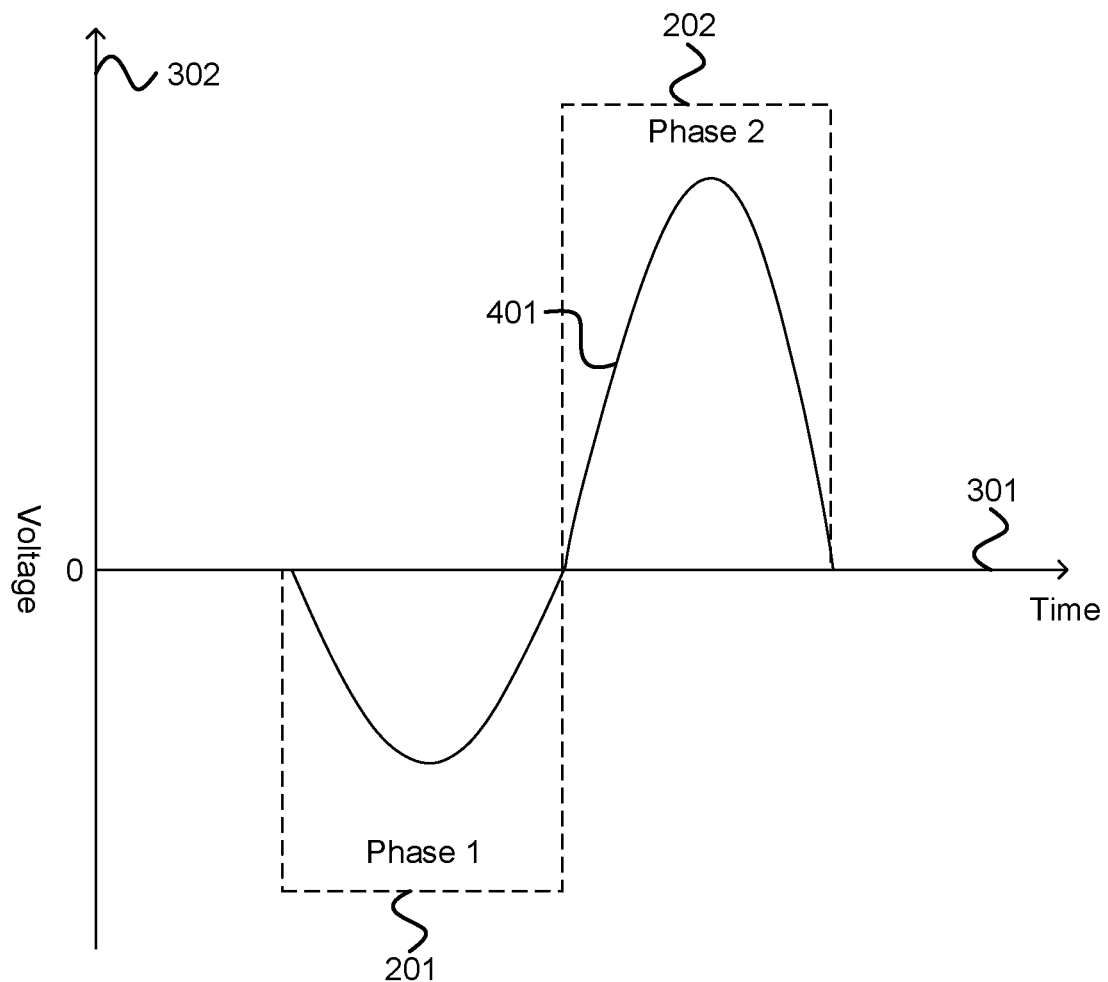
FIG. 4 illustrates a schematic representation of a voltage applied over a haptic effect element according to an embodiment.

FIG. 4 illustrates a schematic representation of a voltage applied over an addressed haptic effect element 101' according to an embodiment. The voltage 401 presented in the embodiment of FIG. 4 may correspond to the pulses 303, 304 presented in the embodiment of FIG. 3.

As can be seen from the embodiment of FIG. 4, the voltage 401 applied over the addressed haptic effect element 101' may be negative during phase 1 201 and positive during phase 2 202. This is due to the fact that during phase 1 201, the driving circuit 105 may apply the positive driving voltage to the addressed column 103', and during phase 2

202, the driving circuit 105 may apply the positive driving voltage to the addressed row 102'. Thus, the voltage 401 over the addressed haptic effect element 101' can change sign between phase 1 201 and phase 2 202. Polarity of the voltage 401 is dependent on how the voltage is measured. Thus, the voltage 401 could also be positive during phase 1 201 and negative during phase 2 202.

The voltage 401 may be referred to as bipolar. Such bipolar voltage can be achieved even if the driving circuit 105 does not comprise a bipolar booster, since the driving circuit 105 can drive the positive voltage to a column in phase 1 201 and to a row in phase 2 202 or vice versa, as described above. This may reduce the amount of hardware needed, since a bipolar voltage booster or two separate voltage boosters may not be needed.

Figure 5:
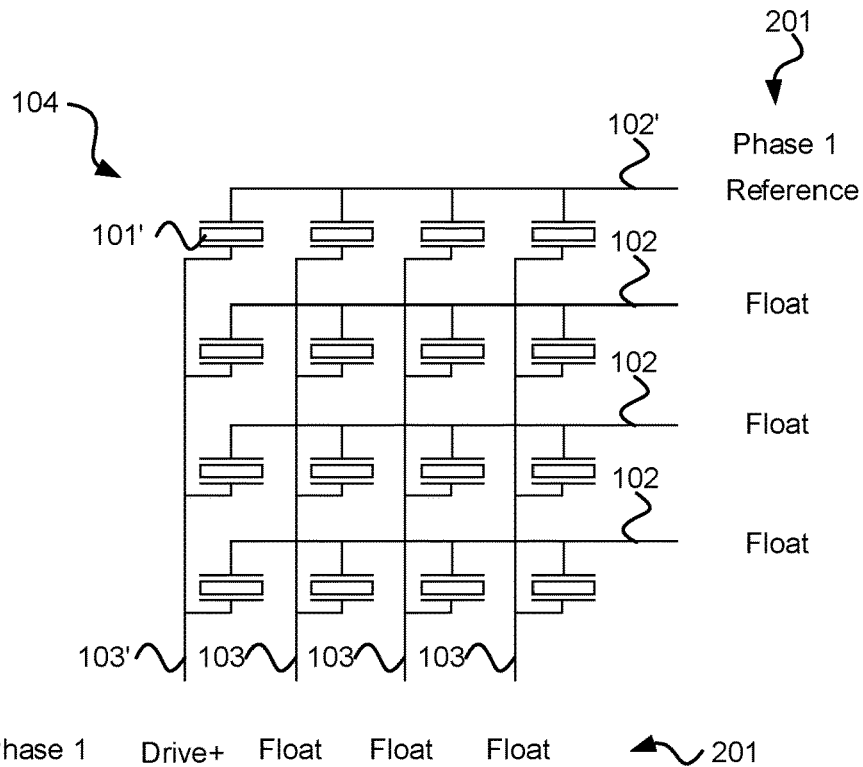
FIG. 5 illustrates a schematic representation of haptic effect element addressing according to an embodiment.

FIG. 5 illustrates a schematic representation of haptic effect element addressing according to an embodiment. Only phase 1 201 may be used to address a haptic effect element by applying a positive voltage to the addressed column 103' while applying a reference voltage to the addressed row 102'. Alternatively, the positive voltage may be replaced with a negative voltage or the positive or negative voltage may be applied to the addressed row 102' while driving the reference voltage to the addressed column 103'. The driving circuit 105 may also leave some rows/columns floating as described herein.

Figure 6:
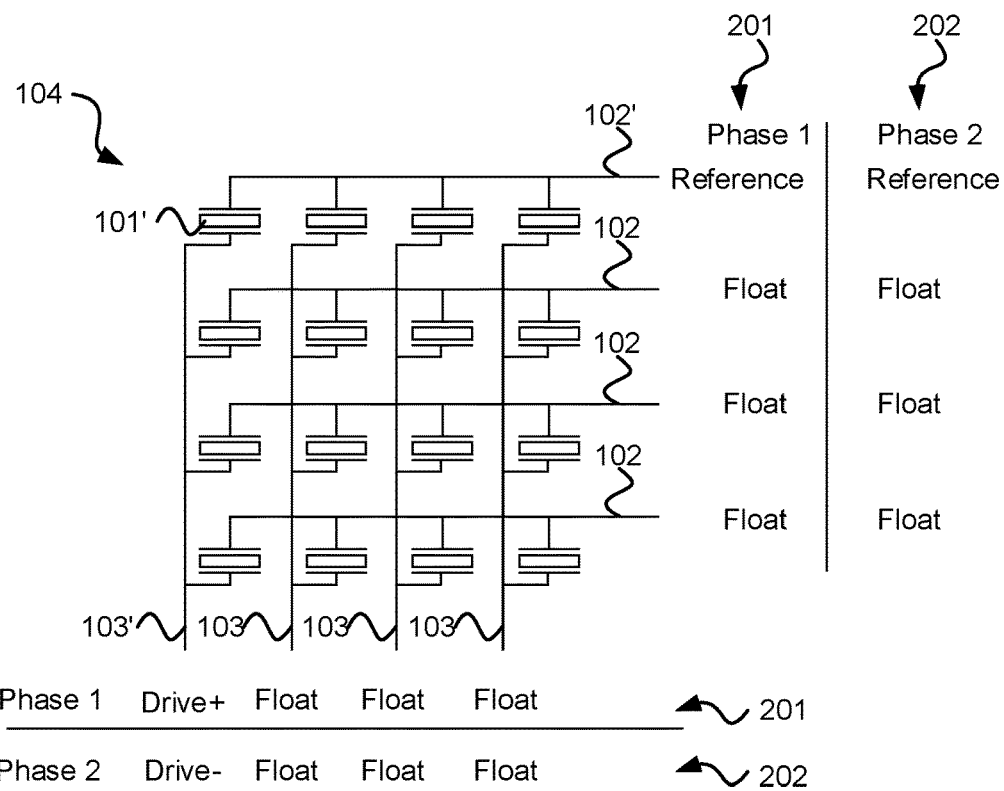
FIG. 6 illustrates a schematic representation of haptic effect element addressing according to another embodiment

FIG. 6 illustrates a schematic representation of haptic effect element addressing according to an embodiment. In the embodiment of FIG. 6, similarly to the embodiments of FIGS. 2 and 5, during phase 1 201, the driving circuit 105 may drive a positive voltage to the addressed column 103' and a reference voltage to the addressed row 102'.

During phase 2 202, on the other hand, the driving circuit 105 may drive a negative voltage to the addressed column 103', while driving a reference voltage to the addressed row 102'. This way, a bipolar voltage may be achieved over the addressed haptic effect element 101' similarly to the embodiment of FIG. 2. The driving circuit 105 may also leave some rows/columns floating as described herein.

If two or more haptic effect elements 101 need to provide haptic effect simultaneously, the haptic effect elements may be addressed using time interleaving. This may be beneficial, if the haptic effect elements 101 to be addressed are located in different row and column. If the haptic effect elements 101 to be addressed are located in the same row or column, they can be addressed without time interleaving. The addressing of each haptic effect element may be implemented using, for example, any embodiment described herein. For example, such haptic effect elements 101 may be addressed consecutively in time fast enough that a user cannot distinguish time difference between the consecutive haptic effects. For example, the time interval between such consecutive addressings may be less than 100 ms, 50 ms, 30 ms, 25 ms, 20 ms, 15 ms, 10 ms, 5 ms, 2 ms, 1 ms, 0.5 ms, or 0.1 ms. Maximum length of the time interval for the haptic effects to feel simultaneous may vary from person to person. The time interval may be measured, for example, between the end of the first addressing and the start of the second addressing. Such interleaving may avoid possible issues in matrix addressing.

According to an embodiment, the driving circuit 105 is further configured to address at least two different haptic effect elements in the haptic element matrix 104 consecutively. According to a further embodiment, a time interval between the consecutive addressings is short enough that haptic effects due to the consecutive addressings seem simultaneous to a human. For example, a time interval between the consecutive addressings is less than 30 milliseconds.

The device 100 may also be configured to perform both haptic effect and touch detection using the haptic effect elements 101 of the haptic element matrix 104. In such cases, the haptic effect may disturb the touch sensing, if the haptic effect and the touch sensing are used simultaneously. Thus, the haptic effect and touch sensing may be implemented in a time interleaved fashion. For example, the device 100 may implement a recovery period between the haptic effect and the touch sensing.

Figure 7:
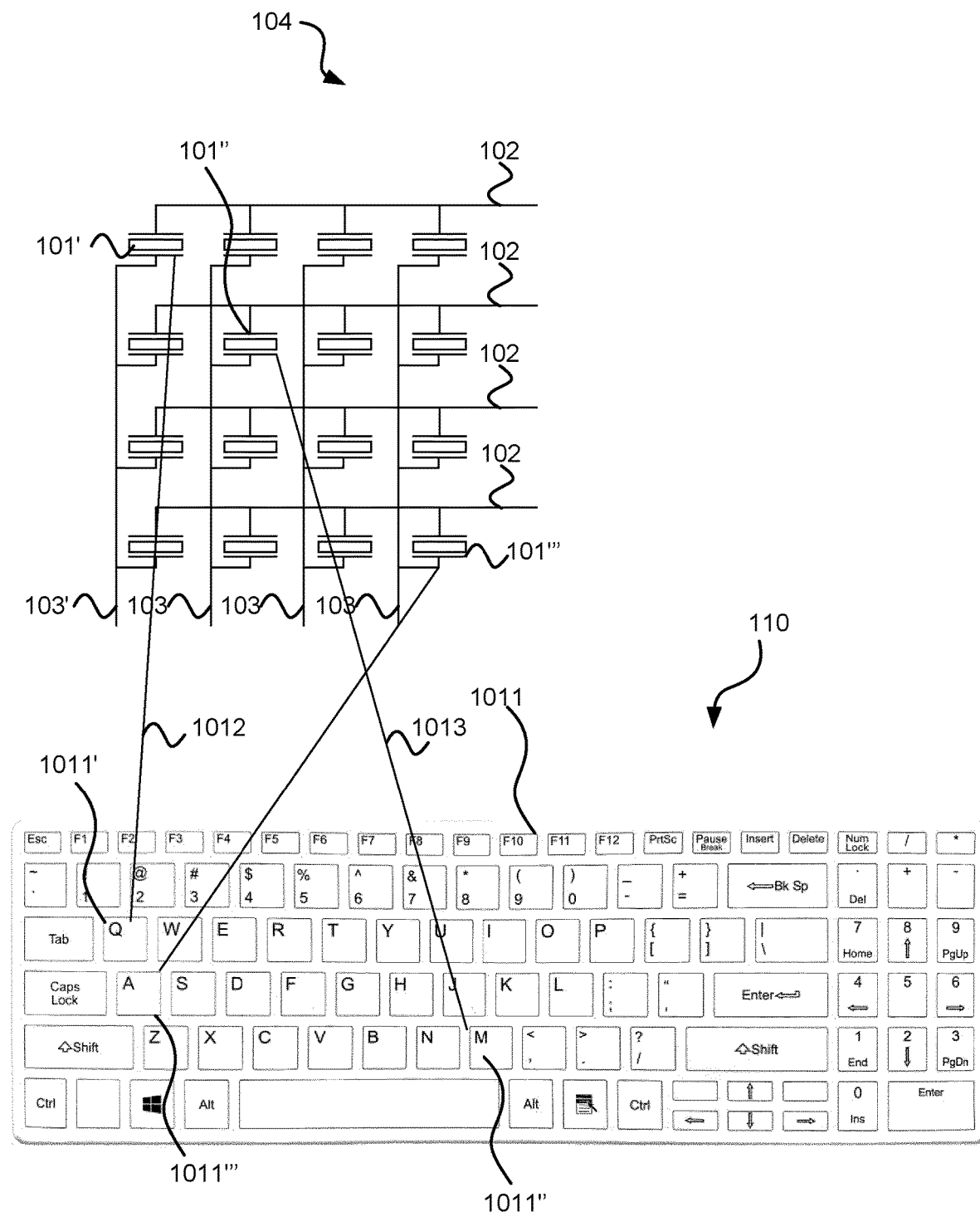
FIG. 7 illustrates a schematic representation of haptic feed matrix and a correspondence to a keyboard according to an embodiment.

FIG. 7 illustrates a schematic representation of a correspondence between the haptic element matrix 104 and a keyboard 110 according to an embodiment. If the haptic effect elements 101 are used to provide haptic effect for keys 1011 of a keyboard 110, the keys 1011 may be positioned physically differently depending on the desired neighboring distortion effects. For example, haptic effect may be provided for neighboring keys by haptic effect elements 101 that are not electrically neighboring in the haptic element matrix 104. This way, if any unwanted haptic effect is generated in a non-addressed haptic effect element 101 due to a neighboring haptic effect element 101' being addressed, the unwanted haptic effect is less likely to affect the touch sensation felt by the user. Thus, for example a so-called QWERTY-keyboard may be designed in such a way that user's fingers may not be disturbed by unwanted haptic effects. A correspondence 1012 between a haptic effect element 101' and a key 1011' is shown in FIG. 7. Another correspondence 1013 between a haptic effect element 101" and a key 1011" is shown, and yet another correspondence 1014 between a haptic effect element 101''' and a key 1011''' is shown. As can be perceived the keys 1011' and 1011" are not neighboring, but keys 1011' and 1011''' are neighboring in the keyboard 110. In the matrix 104, haptic effect elements 101' and 101''' are not neighboring, but haptic effect elements 101' and 101" are neighboring.

The haptic effect elements 101 may be configured to provide haptic effect for an area that may not correspond to a single button. For example, a haptic effect element 101 may provide haptic effect for a certain area of a touchscreen or for multiple buttons.

According to an embodiment, the haptic effect elements 101 in the haptic element matrix 104 comprise piezoelectric elements.

According to a further embodiment, the haptic effect elements 101 in the haptic element matrix 104 are further configured to detect touch.

For example, the device 100 may further comprise a controller. The controller may be integrated with the driving circuit 105. When a haptic effect element 101 is pressed by a user, a voltage may be generated between the row 102 and column 103 connected to the haptic effect element 101. This voltage may be detected by the controller electrically coupled to the row 102 and column 103. For example, the controller may comprise analog-to-digital converters (ADCs) that may be configured to convert the analog voltage to a digital signal. Based on the row 102 and the column 103, the controller can detect which haptic effect element 101 was pressed.

ADCs in the controller connected to rows 102 and columns 103 where the haptic effect elements 101 are not touched can detect significantly lower signals in comparison to the ADCs connected to the rows 102 and columns 103 where the haptic effect element 101 is touched. There can be several haptic effect elements 101 touched, pressed, swiped, or otherwise actuated by the user at the same time, providing large enough signal differences on several pairs of rows 102 and columns 103, which can be detected and recognized in the controller. Different and adjustable sensitivity thresholds can be used for recognition of different kind of touch events in the controller.

The controller may be further configured to utilize also relative information from the haptic effect elements 101 to record also movements of finger(s), pressure profiles, etc. Based on the detected signals, the controller may drive the haptic effect elements 101, as disclosed herein, to provide haptic experiences for the user.

Figure 8:
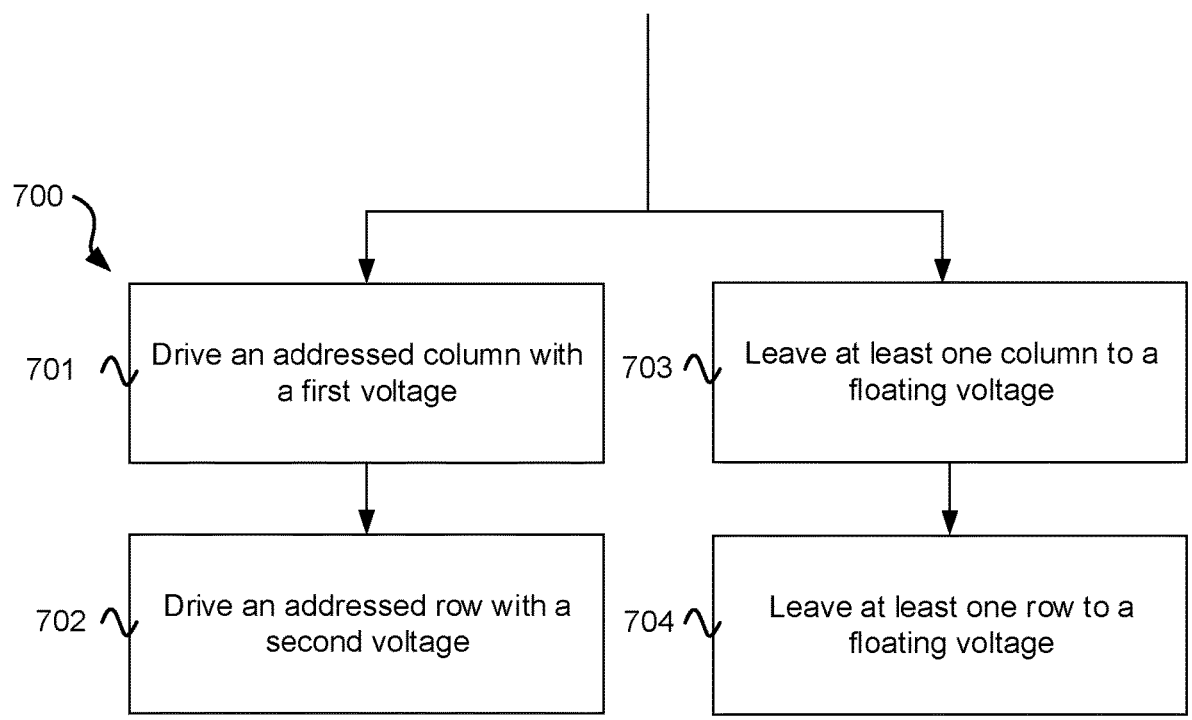
FIG. 8 illustrates a flowchart representation of a method according to an embodiment.

FIG. 8 illustrates a flowchart representation of a method 700 according to an embodiment. The method 700 may comprise driving 701 an addressed column of a haptic element matrix with a first voltage. The method 700 may further comprise driving 702 an addressed row of the haptic element matrix with a second voltage. The method 700 may further comprise leaving 703 at least one column of the haptic element matrix to a floating voltage while driving the addressed column and the addressed row. The method 700 may further comprise leaving 704 at least one row of the haptic element matrix to a floating voltage while driving the addressed column and the addressed row.

Although the flowchart representation of the method 700 in the embodiment of FIG. 8 may indicate a certain order for the steps 701-704 of the method 700, the steps 701-704 may be performed in any order. Furthermore, one or more of the steps 701-704 may be performed substantially simultaneously.

The device 100 and/or the method 700 may be utilized in, for example, laptop trackpads. The haptic element matrix 104 may be configured to determine a force threshold and provide a tactile (click) confirmation. When a mechanical click function is replaced with the haptic element matrix 104, thickness of the trackpad stack may be reduced and it may be possible to provide a more precise and uniform click sensation. "Uniform" may mean that the click sensation is similar no matter where the finger touches on the surface. The haptic element matrix 104 may enable new functionalities, for instance providing a tactile sensation on the trackpad when the computer cursor moves across a virtual button on a screen. The force sensitivity on the trackpad surface may also offer new possibilities. For example, pressing harder with a finger could trigger certain functions on the computer (like shortcut functions).

The device 100 and/or the method 700 may also be utilized in, for example, vehicles, such as cars. The device 100 and/or the method 700 may provide haptic effects as a user/driver of a vehicle interacts with various systems, such as information systems, entertainment systems, and/or control systems, of the vehicle.

The device 100 and/or the method 700 may also be utilized in, for example, creating a full qwerty (laptop) keyboard, replacing the mechanical keys. This may provide at least some of the following benefits: save space (thinner stack=thinner laptop), increased robustness, seamless, closed surface may be easy to clean, new design options—material choices, new functionality and faster typing speed, (for example, select caps letter by applying more pressure with finger on a key), fully configurable—the user can change the way the keys feel (more or less "key travel", sensitivity, audio sound from keys).

When the device 100 and/or the method 700 is combined a screen/display, it may be possible to create a virtual on-screen keyboard without compromising the tactile feeling/feedback. The benefit of virtual keyboard may be that the layout of the keys (position and function) may be easily reconfigurable for example when changing between languages or certain applications (text editing vs gaming for example).

In some embodiments, one haptic effect element 101 may correspond to one key on a keyboard. This may require, for example, up to 100 haptic feedback elements 101 for a full qwerty keyboard. Each haptic effect element may need to be wired/connected to the controller/driver/booster. With so many individual haptic effect elements 101, the haptic element matrix 104 may reduce the number of connectors and complexity of wiring.

The device 100 and/or the method 700 may also be utilized in combination with a display. It may also be possible to create more tactile experiences, for instance feeling textures, ridges or other structures while moving a finger across the surface/display.

In some embodiments, the haptic effect elements 101 may not be discrete elements. Instead, it may also be possible to deposit piezoelectric material on a carrier material and utilize such a layer of piezoelectric material in the haptic element matrix 104. This may reduce costs and make assembly easier.

The functionality described herein can be performed, at least in part, by one or more computer program product components such as software components. According to an embodiment, the device comprise a processor, such as a microcontroller, configured by the program code when executed to execute the embodiments of the operations and functionality described. Alternatively, or in addition, the functionality described herein can be performed, at least in part, by one or more hardware logic components. For example, and without limitation, illustrative types of hardware logic components that can be used include Field-programmable Gate Arrays (FPGAs), application-specific Integrated Circuits (ASICs), application-specific Standard Products (ASSPs), System-on-a-chip systems (SOCs), Complex Programmable Logic Devices (CPLDs), Graphics Processing Units (GPUs).

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A device, comprising:
a haptic element matrix comprising haptic effect elements, wherein the haptic effect elements are electrically arranged into rows and columns; and
a driving circuit configured to, in a first phase:
drive an addressed column of the haptic element matrix with a first voltage;
drive an addressed row of the haptic element matrix with a second voltage;
leave all other columns of the haptic element matrix to a floating voltage while driving the addressed column and the addressed row; and
leave all other rows of the haptic element matrix to the floating voltage while driving the addressed column and the addressed row;
wherein one of: the first voltage and the second voltage, comprises a voltage pulse, and the other comprises a substantially constant reference voltage;
wherein the haptic effect elements in the haptic element matrix comprise discrete piezoelectric elements.

2. The device according to claim 1, wherein an impedance between the floating column or row and the substantially constant reference voltage is at least 100 kilo-ohms.

3. The device according to claim 1, wherein the driving circuit is further configured to, in a second phase, after the first phase:
drive the addressed column of the haptic element matrix with a third voltage;
drive the addressed row of the haptic element matrix with a fourth voltage;
leave all other columns of the haptic element matrix to the floating voltage while driving the addressed column and the addressed row; and
leave all other rows of the haptic element matrix to the floating voltage while driving the addressed column and the addressed row.

4. The device according to claim 3, wherein:
the second voltage and the third voltage comprise the substantially constant reference voltage and the first voltage comprises a first voltage pulse and the fourth voltage comprises a second voltage pulse; or
the first voltage and the fourth voltage comprise a substantially constant reference voltage and the second voltage comprises a first voltage pulse and the third voltage comprises a second voltage pulse.

5. The device according to claim 4, wherein the first voltage pulse and the second voltage pulse have a same polarity with respect to the substantially constant reference voltage.

6. The device according to claim 5, wherein
the second voltage and the fourth voltage comprise the substantially constant reference voltage and the first voltage comprises a first voltage pulse and the third voltage comprises a second voltage pulse; or
the first voltage and the third voltage comprise the substantially constant reference voltage and the second voltage comprises a first voltage pulse and the fourth voltage comprises a second voltage pulse.

7. The device according to claim 6, wherein the first voltage pulse and the second voltage pulse have opposite polarities with respect to the substantially constant reference voltage.

8. The device according to claim 1, wherein the driving circuit is further configured to:
address at least two different haptic effect elements in the haptic element matrix consecutively.

9. The device according to claim 8, wherein the time interval between the consecutive addressings is less than 30 milliseconds.

10. The device according to claim 1, wherein the haptic effect elements in the haptic element matrix are further configured to detect a touch.

11. The device according to claim 1, wherein a first terminal of the haptic effect element is connected to a row conductor of the rows and a second terminal of the haptic effect element is connected to a column conductor of the columns.

12. The device according to claim 1, wherein a haptic effect is produced to a certain haptic effect element situated at an intersection of the driven addressed row and the driven addressed column.

13. The device of claim 1, further comprising a keyboard matrix including different keys, wherein the keys are configured to the keyboard matrix so that neighboring keys of a certain key corresponding to a certain haptic effect element are different from neighboring haptic effect elements of the certain haptic effect element.

14. A method for driving a haptic element matrix comprising haptic effect elements, wherein the haptic effect elements are electrically arranged into rows and columns, the method comprising:
driving an addressed column of a haptic element matrix with a first voltage;
driving an addressed row of the haptic element matrix with a second voltage;
leaving all other columns of the haptic element matrix to a floating voltage while driving the addressed column and the addressed row; and
leaving all other rows of the haptic element matrix to the floating voltage while driving the addressed column and the addressed row;
wherein one of: the first voltage and the second voltage, comprises a voltage pulse, and the other comprises a substantially constant reference voltage
wherein the haptic effect elements in the haptic element matrix comprise discrete piezoelectric elements.

15. A non-transitory computer program product comprising program code configured to perform a method according to claim 14 when the computer program code is executed on a computing device.

* * * * *